United States Patent [19]

Moulton et al.

[11] Patent Number: 5,212,409
[45] Date of Patent: May 18, 1993

[54] ANALOG-TO-DIGITAL CONVERTER LATCH CIRCUIT

[75] Inventors: Clifford H. Moulton, Beaverton; Philip S. Crosby, Portland, both of Oreg.

[73] Assignee: Tektronix, Inc., Wilsonville, Oreg.

[21] Appl. No.: 851,115

[22] Filed: Mar. 16, 1992

Related U.S. Application Data

[63] Continuation of Ser. No. 682,775, Apr. 9, 1991, abandoned.

[51] Int. Cl.[5] .................. H03K 5/00; H03K 3/29
[52] U.S. Cl. .................. 307/261; 307/272.1; 307/289; 307/291; 307/530; 341/155; 341/165
[58] Field of Search .................. 307/260, 272.1, 272.2, 307/289, 291, 530, 276, 247.1, 261; 341/163, 165, 155

[56] References Cited

U.S. PATENT DOCUMENTS

| | | | |
|---|---|---|---|
| 4,506,171 | 3/1985 | Evans et al. | 307/530 |
| 4,802,130 | 1/1989 | Soneda | 307/530 |
| 4,814,642 | 3/1989 | Kleks | 307/279 |
| 4,858,195 | 8/1989 | Soneda | 307/530 |
| 4,965,468 | 10/1990 | Nicollini et al. | 307/530 |

Primary Examiner—Timothy P. Callahan
Attorney, Agent, or Firm—John P. Dellett

[57] ABSTRACT

An analog-to-digital converter latching circuit functions alternatively in a degenerative mode and a regenerative mode. During degeneration, circuit stray capacitances are substantially discharged for resulting in fast operation. When the circuit switches from degeneration to regeneration, a small signal current is able to start the latch in the proper direction without first having to overcome charge stored in the stray capacitances.

4 Claims, 3 Drawing Sheets

ANALOG-TO-DIGITAL CONVERTER LATCH CIRCUIT

This is a continuation of application of Ser. No. 07/682,775 filed Apr. 9, 1991 and now abandoned.

BACKGROUND OF THE INVENTION

The present invention relates to an analog-to-digital converter latch circuit, and particularly to such a circuit as characterized by rapid operation.

Attempts are continually being made to advance the state of the art in the development of faster means of conversion from an analog signal to a digital value. In a typical analog-to-digital converter, one or more comparators receive an analog signal and produce an output relative to one or more fixed analog levels. At a given sampling time the comparison result may be applied to a bistable circuit or latch for temporarily representing the level of the analog signal. The state of the latch is then read out in generating the digital result.

The most basic factor limiting high speed performance in an analog-to-digital converter circuit is the capacitance in the circuit layout and in the active devices employed. Unavoidable stray circuit capacitance in parallel with the load resistors needed to produce the requisite voltage gain in the comparator stage causes the signal to be delayed by an amount of time that non-linearly depends on the amount of signal overdrive applied to the comparator stage, and on the rate of change of that signal. RC time constants predict the delay and signal slewing as the comparator output signal propagates into the latch. The input signal may be changing rapidly just prior to operation of the latch and the capacitances associated with the load resistors can be charged at their extreme value an instant before sampling. The initial states of circuit capacitances can therefore cause very large offsets in the time of final response of a comparator.

One solution to the problem might involve retaining the comparator output at a given level prior to sampling, i.e. maintaining the comparator's mid-state level corresponding to the meta-stable level for the following latch. Holding the output of the comparator at the mid-state value could be accomplished by means of analog switches. However, besides being inherently slow, stray capacitances are also associated with this method.

SUMMARY OF THE INVENTION

In accordance with the present invention, an analog-to-digital converter latch is set to an initial condition determined by a degenerative portion of the circuit which discharges the initial disturbing charge. The output lines of the comparator are drawn together as with a low shunting impedance and even though the comparator output signal current may remain active, it cannot produce a large output swing. When sampling is to occur, a regenerative portion of the circuit becomes active and the standing current at the output of the comparator determines the next latch state.

In one embodiment according to the present invention a pair of active elements, e.g. transistors, form a latch circuit and coupling means alternately connect degenerative and regenerative signal paths in the circuit. According to another embodiment, the circuit comprises a first pair of elements forming a degenerative circuit and a second pair of elements comprising a regenerative latch, with current switching means being employed at sampling time to switch from operation of the first pair to operation of the second pair.

It is accordingly an object of the present invention to provide an improved analog-to-digital converter latch circuit characterized by rapid operation.

It is another object of the present invention to provide an improved analog-to-digital converter latch circuit having an apparent sampling time that is less affected by stray capacitance than circuits heretofore available.

It is another object of the present invention to provide an improved analog-to-digital converter latch circuit less affected by slewing and delay problems than prior circuits.

The subject matter of the present invention is particularly pointed out and distinctly claimed in the concluding portion of this specification. However, both the organization and method of operation of the invention, together with further advantages and objects thereof, may best be understood by reference to the following description taken in connection with accompanying drawings wherein like reference characters refer to like elements.

DRAWINGS

FIG. 1 is a schematic diagram of an analog-to-digital converter circuit according to a first embodiment of the present invention, FIG. 2 is a schematic diagram of an analog-to-digital converter circuit in accordance with a second embodiment of the present invention, and FIG. 3 is a schematic diagram of an analog-to-digital converter circuit according to a third embodiment of the present invention.

DETAILED DESCRIPTION

Figure 1:
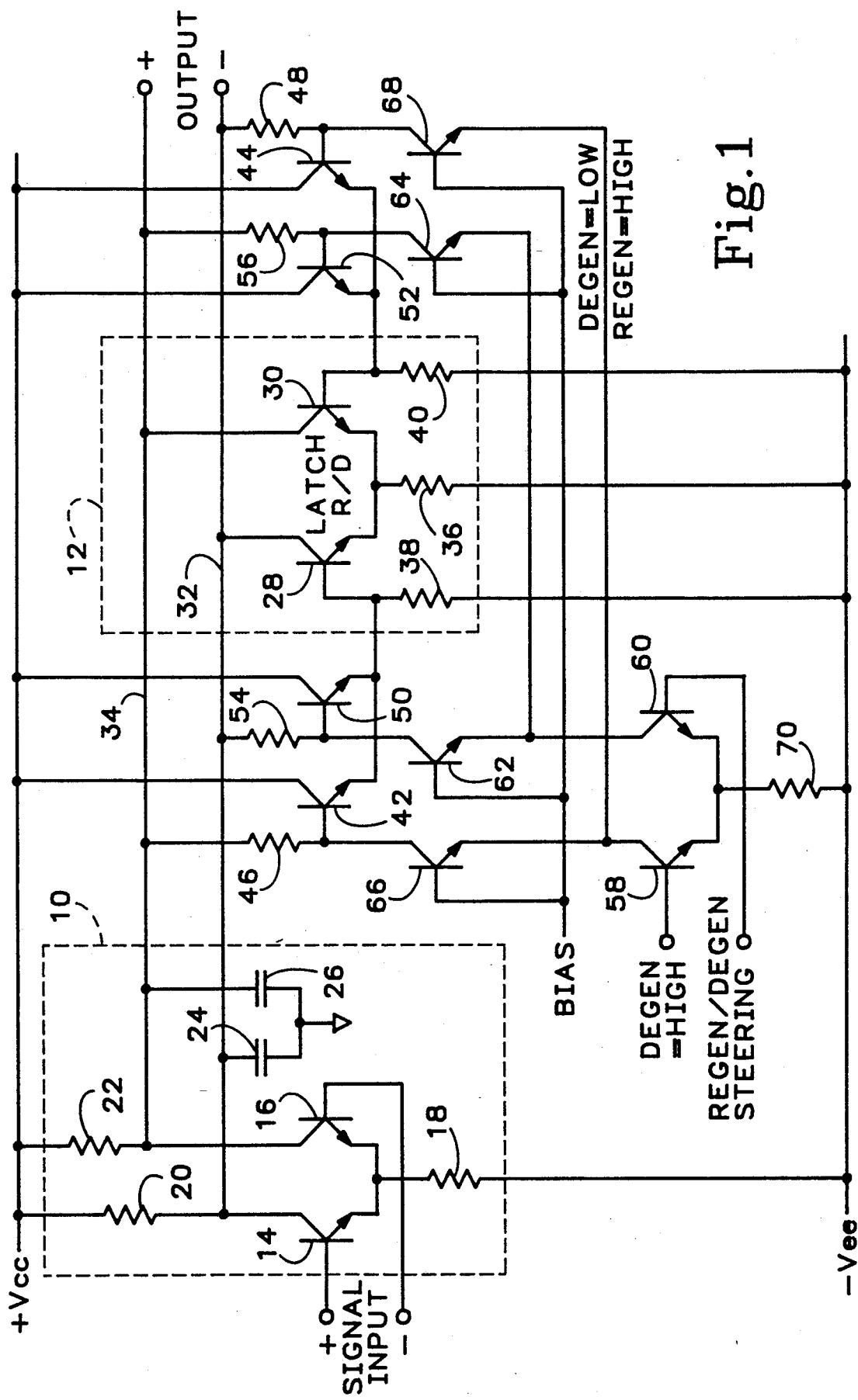

Referring to FIG. 1, an A to D converter suitably includes a comparator 10 for driving latch 12. The comparator 10 compares an analog signal input with some predetermined level and provides an output capable of setting the state of latch 12 as between a first stable state and a second stable state that can be read out by digital circuitry.

Considering the FIG. 1 circuit in greater detail, comparator 10 suitably includes first and second transistors 14 and 16 having their emitters returned in common to a negative voltage source via resistor 18. The collector of transistor 14 is connected to a positive voltage source through load resistor 20, while the collector of transistor 16 is similarly connected to the positive voltage source by way of load resistor 22. Capacitors 24 and 26 represent stray capacitances associated with load resistors 20 and 22.

Latch 12, which shares load resistors 20 and 22 with circuit 10, includes first and second transistors 28 and 30 having their collectors respectively connected to conductors 32 and 34, leading to the aforementioned load resistors, and a common emitter resistor 36 returned to negative supply. Input resistor 38 is disposed between the base of transistor 28 and the negative supply, while input resistor 40 is similarly interposed between the base of transistor 30 and the negative supply. Resistor 36 should be chosen such that a substantially greater current flows through latch 12 than through comparator 10.

The transistors 42 and 44 are connected in emitter-follower fashion between lines 34 and 32 and the respective bases of transistors 28 and 30 of the latch. A coupling resistor 46 is interposed between line 34 and the base of transistor 42, while the emitter of transistor 42 is connected to the base of transistor 28. Similarly, a coupling resistor 48 is provided between line 32 and the base of emitter-follower transistor 44 having its emitter connected to the base of latch transistor 30. This circuit provides the cross-coupled feedback for latching action of latch 12.

Further, according to the present invention, a second pair of emitter-follower transistors 50 and 52 is provided between the lines 32 and 34 and the latch transistors. Line 32 is coupled via resistor 54 to the base of transistor 50 having its emitter connected to the base of latch transistor 28, while a coupling resistor 56 is disposed between line 34 and the base of transistor 52, the emitter of which is connected to the base of latch transistor 30.

The circuit including transistors 50 and 52 comprises a degenerative circuit coupling the collectors of the respective latch transistors to their own bases for providing strong degeneration prior to the desired sampling time. The capacitors 24 and 26 are thereby initially discharged and the output lines 32 and 34 are drawn together as with a low shunting impedance across the differential output. Even though the comparator 10 may remain active, it cannot produce a large output swing. The degenerative stage 50, 52 sets the initial conditions as desired.

Transistors 50 and 52 are initially turned on until sampling time, at which time transistors 50 and 52 are turned off and transistors 42 and 44 are activated to provide a regenerative latching function. The polarity of the voltage difference between the output nodes at the time that transistors 42 and 44 are activated determines the stable state of latch 12.

To switch between degenerative and regenerative operation, a current switching circuit comprising transistors 58, 60, 62, 64, 66 and 68 is utilized. The emitters of transistors 58 and 60 are returned in common to the negative voltage source by way resistor 70, and their bases receive a regenerative/degenerative differential steering input. For degeneration, the input provided to the base of transistor 58 is high, while that applied at the base of transistor 60 is low. The collector of transistor 58 is connected in common to the emitters of transistors 66 and 68 having their bases connected to a common bias voltage. The collector of transistor 60 is connected in common to the emitters of transistors 62 and 64, the bases of which are connected to the common bias voltage. The application of the degeneration input to the transistor pair 58, 60, i.e., high signal at the base of transistor 58, causes transistor 58 to conduct pulling down on the emitters of transistors 66 and 68. Consequently, transistors 66 and 68, having their collectors coupled to the bases of transistors 42 and 44, will conduct for cutting off transistors 42 and 44, whereby regenerative action is prevented. However, transistor 60 is non-conductive at this time, as are transistors 62 and 64, the emitters of which are connected to the collector of transistor 60. Since the collectors of transistors 62 and 64 are respectively connected to the bases of transistors 52 and 54, and transistors 62 and 64 are non-conducting, transistors 50 and 52 are enabled to conduct to provide degenerative action, wherein the collectors of transistors 28 and 30 are coupled to their own bases by way of transistors 50 and 52.

When the input to the bases of transistors 58 and 60 is reversed, current flows through transistor 60 causing conduction through transistors 62 and 64 for lowering the bases of transistors 50 and 52 below their conduction level. Transistor 58 is now non-conductive, transistors 66 and 68 no longer bias transistors 42 and 44 to a non-conductive condition, and consequently regenerative action can take place as hereinbefore mentioned as transistors 42 and 44 conduct for setting the state of latch 12. Regeneration causes the latch to assume one of two stable states with one of its transistors conducting and the other non-conducting.

Since the impedance seen by the differential signal current from the comparator output is low and the time constant is short, when the latch is switched to the regenerative condition, the currents in transistors 28 and 30 will regeneratively change from near-equality to their fully switched state. Since the latch was nearly balanced prior to being switched to its regenerative condition, its eventual state is primarily determined by the history of the comparator current at and shortly after the latch is switched to its regenerative condition. The speed and the accuracy of strobing fast signal events into the A to D converter are thereby increased.

Figure 2:
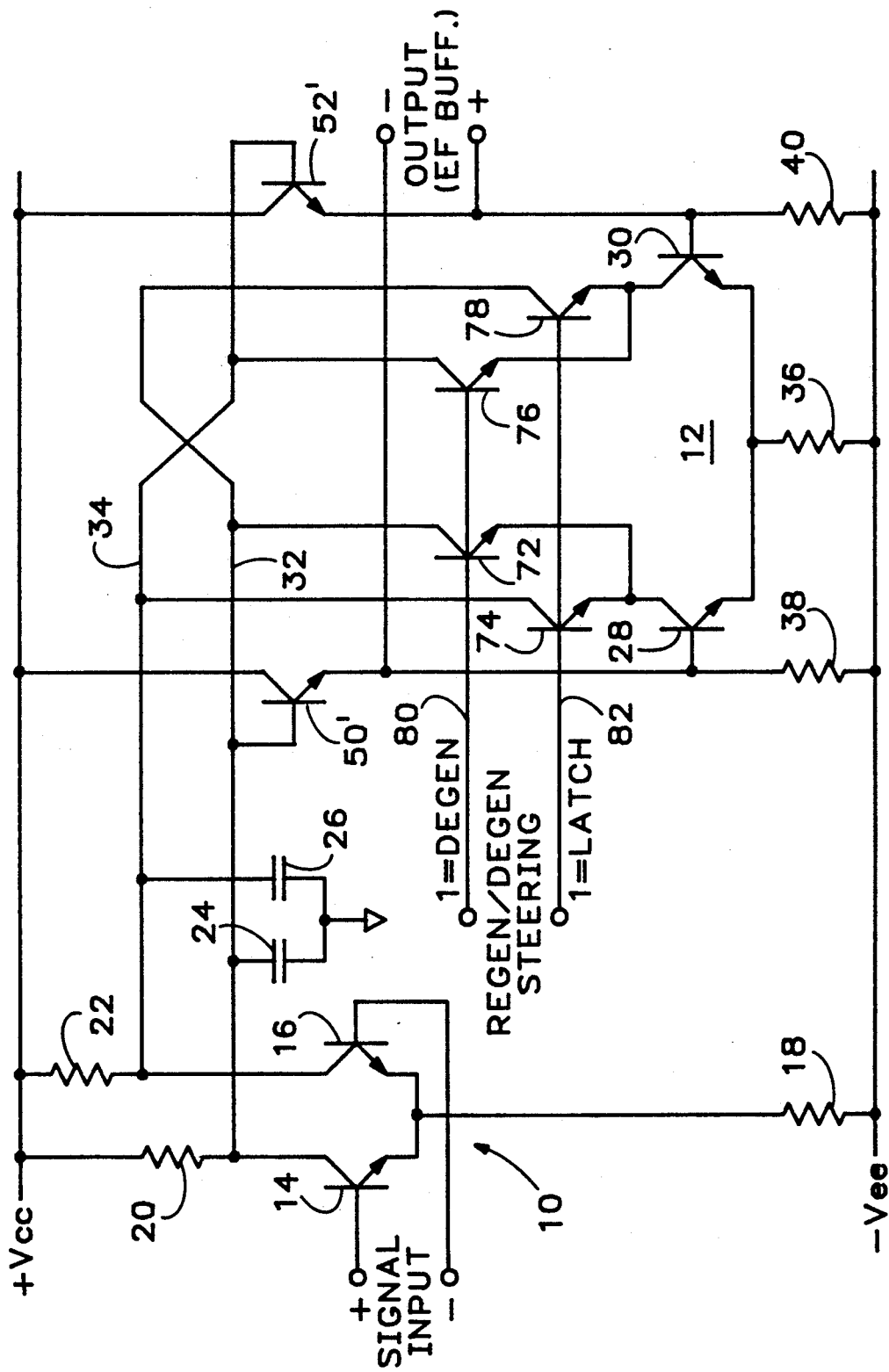

Referring now to FIG. 2, illustrating a second embodiment according to the present invention wherein like elements are designated by like reference numerals, the current steering circuitry in FIG. 1 is replaced with a cascode switched section to steer latch output polarity. The latch 12, again comprising transistors 28 and 30 having their emitters returned in common to a negative voltage via resistor 36, is in this case driven by a transistor 50' having its base connected to line 32 and its emitter connected to the base of transistor 28, as well as by transistor 52' having its base connected to line 34 and its emitter connected to the base of transistor 30. However, the collector of transistor 28 is coupled in the alternative through either the collector emitter path of transistor 72 to line 32, or through the collector emitter path of transistor 74 to line 34. Similarly, the collector of transistor 30 is alternatively coupled to line 32 through the collector emitter path of transistor 78, or to line 34 through the collector emitter path of transistor 76. The bases of transistors 72 and 76 receive one side of a differential regeneration/degeneration steering signal, with the bases of transistors 74 and 78 receiving the opposite side of the same signal. For degenerative action, i.e., prior to signal sampling, a relatively positive signal on line 80 leading to the bases of transistors 72 and 76 enables the degenerative circuit from the collectors of transistors 28 and 30 to their own bases. However, a relatively positive signal on lead 82 coupled to the bases of transistors 74 and 78 establishes cross-coupling in the latch stage. Regenerative versus degenerative coupling is accomplished by means of the switching provided in the collector circuit of circuit 12. Thus, transistors 72 and 76 respectively couple the collectors of the latch transistors to their own bases, while transistors 74 and 78 couple the collectors of the latch transistors to bases of the opposite latch transistor. The output of the circuit is taken via emitter-follower-buffered connections at the emitter electrodes of transistors 50' and 52'.

Figure 3:
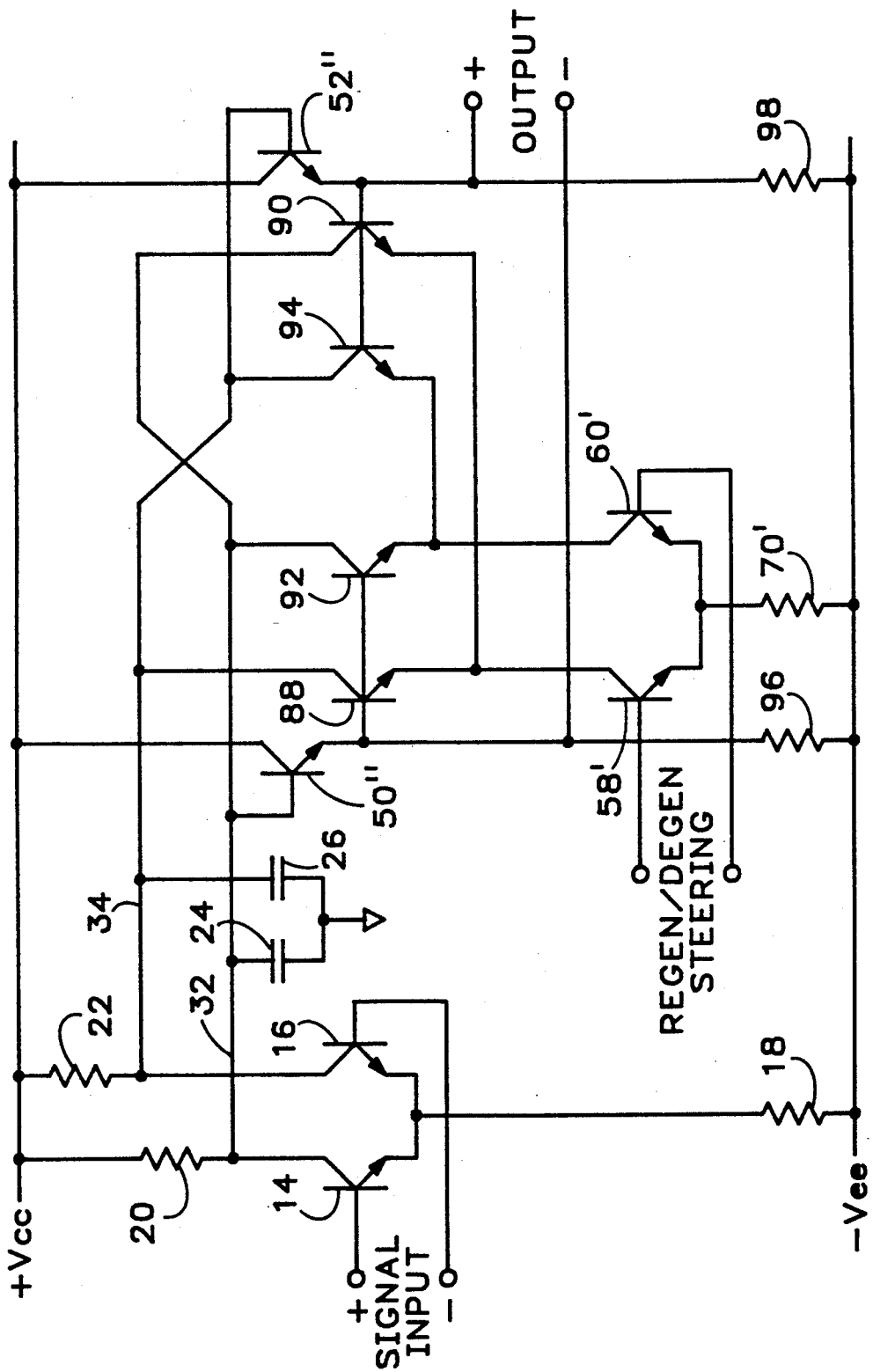

Referring now to FIG. 3, illustrating a third embodiment according to the present invention where like elements are referenced with corresponding numerals, the degenerative/regenerative circuit is divided into a regenerative latch comprising transistors 88 and 90 having a common emitter connection at the collector of current steering transistor 58', and a degenerative stage comprising transistors 92 and 94 having their emitters joined in common at the collector of current steering transistor 60'. The collector of transistor 88 is connected to line 34 which is also applied to the base of transistor 90 in a cross-coupled arrangement through emitter-follower transistor 52" having its collector connected to a positive voltage source and its emitter returned to negative supply through resistor 98. The collector of transistor 90 is connected to line 32 which drives the base of transistor 88 in a cross-coupled manner through emitter-follower transistor 50" having its collector connected to a positive voltage and its emitter returned to negative supply via resistor 96. Current is supplied to the current-steering transistors 58' and 60' through resistor 70'. Resistor 70' should be chosen such that a substantially greater current flows through the latch stage than through the comparator stage. Transistors 88 and 90 form a regenerative latch circuit which is energized by current steering circuit 58', 60' when the differential signal applied to the steering circuit is relatively positive at the base of transistor 58'.

On the other hand, the collector of transistor 92 is coupled to its own base by way of transistor 50", the latter isolating the base of transistor 92 from line 32, while the collector of transistor 94 is coupled to its own base via transistor 52" with the latter isolating the base of transistor 94 from line 34. When the current steering input is relatively positive at the base of transistor 60', the degenerative stage comprising transistors 92 and 94 is active. The output of the circuit is taken between the emitters of transistors 50" and 52".

When the degenerative stage 92, 94 in FIG. 3 is provided current through transistor 60', the stray capacitances 24 and 26 are shunted by strong degenerative action. When sampling is desired, the steering input to transistors 58', 60' is reversed causing the regenerative stage 88, 90 to become active rather than stage 92, 94, whereby the stage 88, 90 rapidly switches to the correct state. A double transistor with common collector tub can be used for each half of the circuit in FIG. 3. One such transistor may provide the function of transistors 88 and 94 while the remaining double transistor can provide the function of transistors 90 and 92.

As in the case of the previously described circuits, the degenerative circuit portion in FIG. 3 acts to discharge the initial disturbing charge on capacitances 24 and 26 and force the comparator output voltage to its mid-region. The comparator outputs are converted to current-mode operation as they determine the next latched state, at the time when degeneration ends and regeneration starts. When the degeneration ends, a small signal current at the output of the comparator collectors can start the latch in the proper direction without first having to overcome the stored charge effects from capacitances 24 and 26.

In the circuits according to the present invention, the effective load resistance is reduced substantially during the degenerative portion of the cycle, for example, to about 16% of its value without degeneration, resulting in an RC time constant in the collector circuit of the comparator that is about 16% of the value without degeneration. As a result, slewing effects on the load resistors by stray capacitance and the like are substantially reduced prior to sample time. At the beginning of regeneration, it will be seen the regeneration action is started more by signal currents from the input comparator and less by voltages retained in historic charges remaining on the comparator collector-circuit capacitances.

While several embodiments of the present invention have been shown and described, it will be apparent to those skilled in the art that many changes and modifications may be made without departing from the invention in its broader aspects. The appended claims are therefore intended to cover all such changes and modifications as fall within the true spirit and scope of the invention.

We claim:

1. An A/D converter comprising:
   a regenerative latch for converting an input to a latch state,
   a degenerative stage having its output coupled to its input in a degenerative manner, said degenerative stage sharing common input and output with said regenerative latch, and
   means for alternately operating said degenerative stage and said regenerative latch for first holding said input and output at a given level while said degenerative state is operable and then enabling regeneration toward the latched state as determined by the input when the regenerative latch is operable.

2. The converter according to claim 1 wherein said regenerative latch comprises a first pair of emitter-coupled transistors and wherein said degenerative stage comprises a second pair of emitter-coupled transistors, said means for selectively operating said degenerative stage and said regenerative latch comprising current steering means for selectively providing current to the emitters of said first pair of emitter coupled transistors and to said second pair of emitter-coupled transistors.

3. The converter according to claim 2 wherein said current steering means comprises a pair of alternately operable transistors receiving a source of current at emitters thereof and having their collectors coupled respectively to emitters of said first and said second pair.

4. A latch circuit comprising:
   a first pair of active elements connected in a degenerative mode so that the input and output are coupled together and held close to a first level,
   a second pair of active elements cross-connected in a regenerative mode so that a signal at the input produces a latched state at the output different from the first level, the first and second pairs of active elements having a common input and output,
   a comparator coupled for receiving an input to produce the signal,
   means for coupling said comparator in driving relationship to said first pair and to said second pair of active elements, and
   means for alternatively operating said first pair and said second pair of active elements including first rendering effective said driving relationship between said comparator and said first pair of active elements to provide the first level at the common output, and then rendering effective said driving relationship between said comparator and said second pair of active elements to provide the latched state at the common output.

* * * * *